United States Patent [19]

Kotecki et al.

[11] Patent Number: 5,585,998
[45] Date of Patent: Dec. 17, 1996

[54] ISOLATED SIDEWALL CAPACITOR WITH DUAL DIELECTRIC

[75] Inventors: David E. Kotecki, Hopewell Junction; William H. Ma, Fishkill; Katherine L. Saenger, Ossining, all of N.Y.

[73] Assignee: International Business Machines Corporation, Armonk, N.Y.

[21] Appl. No.: 577,166

[22] Filed: Dec. 22, 1995

[51] Int. Cl.$^6$ .......................... H01G 4/06; H01G 4/008; H01G 7/00

[52] U.S. Cl. .................. 361/321.4; 361/305; 361/313; 361/320; 361/321.5; 437/919; 29/25.42

[58] Field of Search ........................ 361/301.1, 301.4, 361/303–305, 306.1, 306.3, 311–313, 320–321.5; 365/145, 149; 257/295, 306–310; 29/25.41, 25.42; 437/47, 60, 919

[56] References Cited

U.S. PATENT DOCUMENTS

| | | | |
|---|---|---|---|
| 4,591,738 | 5/1986 | Bialas, Jr. et al. | 307/296 R |
| 4,954,927 | 9/1990 | Park | 361/328 |
| 5,081,559 | 1/1992 | Fazan et al. | 361/313 |
| 5,189,503 | 2/1993 | Suguro et al. | 257/310 |
| 5,192,704 | 3/1993 | McDavid et al. | 437/52 |
| 5,208,725 | 5/1993 | Akcasu | 361/313 |
| 5,313,089 | 5/1994 | Jones, Jr. | 257/295 |
| 5,335,138 | 8/1994 | Sandhu et al. | 361/303 |
| 5,365,096 | 11/1994 | Taniguchi | 257/296 |
| 5,366,920 | 11/1994 | Yamamichi et al. | 437/52 |
| 5,371,700 | 12/1994 | Hamada | 365/149 |
| 5,382,817 | 1/1995 | Kashihara et al. | 257/295 |
| 5,383,088 | 1/1995 | Chapple-Sokol et al. | 361/305 |
| 5,397,748 | 3/1995 | Watanabe et al. | 437/239 |
| 5,405,796 | 4/1995 | Jones, Jr. | 437/47 |
| 5,416,042 | 5/1995 | Beach et al. | 437/60 |
| 5,436,477 | 7/1995 | Hashizume et al. | 257/310 |
| 5,438,011 | 8/1995 | Blalock et al. | 437/52 |
| 5,438,012 | 8/1995 | Kamiyama | 437/60 |
| 5,442,213 | 8/1995 | Okudaira et al. | 257/310 |

FOREIGN PATENT DOCUMENTS

| | | | |
|---|---|---|---|
| 62-190869 | 8/1987 | Japan | H01L 27/10 |
| 3-011761 | 1/1991 | Japan | H01L 27/04 |
| 5-343615 | 12/1993 | Japan | H01L 27/04 |
| 7-94599 | 4/1995 | Japan | H01L 21/8242 |

OTHER PUBLICATIONS

D. E. Kotecki and K. L. Saenger, "Fabrication Process for Container and Crown Electrodes in Memory Devices", IBM Technical Disclosure Bulletin, vol. 38, No. 11, Nov. 1995, pp. 197–199.

Primary Examiner—Bot L. Ledynh
Attorney, Agent, or Firm—Alison D. Mortinger

[57] ABSTRACT

An isolated sidewall capacitor with dual dielectric, which includes two capacitors. The first capacitor includes a first conductor on top of a substrate, a first non-conductor on top of and substantially in register with the first conductor, the first conductor and first non-conductor having a first opening formed therein, a non-conductive sidewall spacer formed in the first opening, the non-conductive sidewall spacer having a second opening formed therein, and a second conductor formed in the second opening. The second capacitor includes the second conductor, a first non-conductor disposed over the top portion of the second conductor, a third conductor disposed over the first non-conductor, and the third conductor electrically connected to the first conductor. A second non-conductor isolates the first conductor from the second conductor.

24 Claims, 2 Drawing Sheets

ISOLATED SIDEWALL CAPACITOR WITH DUAL DIELECTRIC

RELATED APPLICATIONS

This invention is related to the following copending U.S. patent applications:

1) Ser. No. 08/577,178, filed Dec. 22, 1995, entitled "Isolated Sidewall Capacitor";

2) Ser. No. 08/577,168, filed Dec. 22, 1995, entitled "Isolated Sidewall Capacitor Having a Compound Plate Electrode";

3) Ser. 08/577,165, filed Dec. 22, 1995, entitled "Isolated Sidewall Capacitor with L-Shaped Dielectric";
all filed on the same day, assigned to the present assignee, and incorporated by reference in their entireties.

FIELD OF THE INVENTION

This invention is directed to capacitors and the manufacture of the same, and more particularly to a stacked capacitor employing a dual dielectric structure which is suitable for use with high dielectric constant materials.

BACKGROUND OF THE INVENTION

In the manufacture of ultra large scale integration (ULSI) circuit devices, DRAM (dynamic random access memory) and FRAM (ferroelectric random access memory) chips have become increasingly dense. As density increases, feature size shrinks, and so too does memory cell size. The capacitors that are an integral part of memory cells must therefore take up a minimum of space (i.e. have a small "footprint") and still be capable of storing large amounts of electrical charge (i.e. a capacitance on the order of 30 fF).

Stacked capacitors are one type of capacitor structure that has achieved a small footprint. However, because capacitance is a function of dielectric area and the dielectric constant of the dielectric material, as the area decreases the dielectric constant must increase. Currently available high dielectric constant materials provide at best a capacitance/area of 100 fF/sq. micron, so the area must be on the order of 0.3 sq microns.

The use of high dielectric constant materials presents a problem when using traditional materials like silicon as an electrode. The silicon can react with the high dielectric constant material or oxidize during deposition of the high dielectric constant material to form an interface layer of silicon dioxide, which reduces the effective dielectric constant of the dielectric material.

Deposition temperature and leakage are other problems involved in high dielectric constant materials. Because they must be deposited at relatively high temperatures, the first-deposited electrode is formed from a high melting point conductive material which does not oxidize or react with the dielectric. In addition, the electrode material should have a large work function to increase the barrier. Platinum (Pt) and other similar material are suitable for use as electrodes in this situation. However, these electrode materials are typically difficult to pattern using conventional processes. For example, using reactive ion etching (RIE) to pattern Pt results in sloped sidewalls which, given a thick layer, can result in a significant reduction of available surface area on which to form the capacitor. Additionally, while high dielectric constant materials must be isolated from silicon, a good connection must be formed between the capacitor and the semiconductor circuit elements in the substrate.

Thus, there remains a need for a capacitor which can be produced using high dielectric constant materials yet avoids the problems associated with a reduction in the effectiveness of the finished structure.

SUMMARY OF THE INVENTION

It is therefore an object of the present invention to provide a capacitor which incorporates a high dielectric constant material which minimizes or avoids contact between silicon and the high dielectric constant material, especially during high dielectric constant material deposition.

It is a further object to provide a capacitor which incorporates a high dielectric constant material which minimizes patterning steps for the electrodes.

It is an additional object to provide a capacitor which incorporates a high dielectric constant material which allows a good connection between the capacitor and the semiconductor circuit elements in the substrate.

It is another object to provide a capacitor which incorporates a high dielectric constant material with an area of approximately 0.3 sq. microns.

It is yet another object to provide a capacitor which incorporates a high dielectric constant material which is suitable for large scale production.

In accordance with the above listed and other objects, a capacitor structure is provided with two capacitors. The first capacitor includes a first conductor on top of a substrate, a first non-conductor on top of and substantially in register with the first conductor, a first opening formed in the first conductor and first non-conductor, a non-conductive sidewall spacer formed in the first opening, the non-conductive sidewall spacer having a second opening formed therein, filled by a second conductor. The second capacitor includes the second conductor, a first non-conductor disposed over the top portion of the second conductor, a third conductor disposed over the first non-conductor, and the third conductor electrically connected to the first conductor. A second non-conductor isolates the first conductor from the second conductor.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

Figure 1:
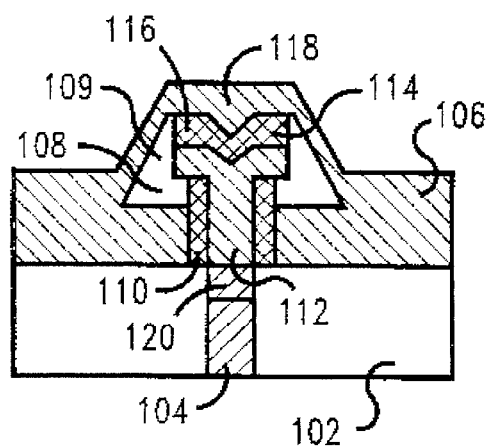
FIG. 1 shows an isolated sidewall capacitor with a dual dielectric.

Referring now to the drawings and more particularly to FIG. 1, a dual dielectric capacitor structure is shown. A substrate (not shown) has a dielectric (non-conductive) layer 102 formed thereon, and a conductive plug 104 embedded in layer 102. Plug 104 provides contact to the desired circuit elements (also not shown) in the underlying substrate. An optional electrically conductive diffusion barrier 120 may be located on top of conductive plug 104. A conductive layer 106 is formed on top of dielectric 102, having an opening therein, which is filled by a high dielectric constant sidewall spacer 110. Sidewall spacer 110 defines another opening which is filled with electrode 112. Electrode 112 has a top portion 114 which extends at least out over sidewall spacer 110, and a high dielectric constant layer 116 is located on top portion 114. Another conductive layer 118 is located on layer 116, and layer 118 joins layer 106. A low dielectric constant material 108 with vertical portion 109 isolates conductive layers 106 and 118 from electrode 112.

Figure 2A:
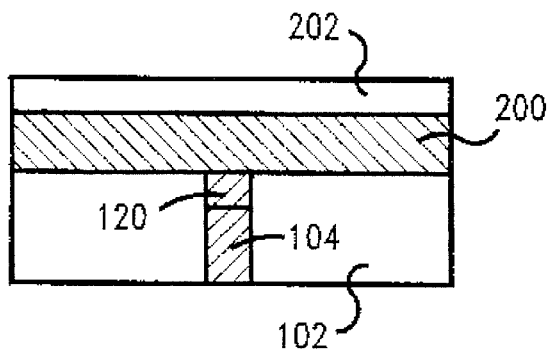
FIGS. 2(a) through 2(g) illustrate the steps to manufacture the dual dielectric capacitor.

FIGS. 2(a) through 2(g) illustrate one set of steps that may be used to manufacture the capacitor of FIG. 1. In FIG. 2(a), dielectric layer 102 has been formed and patterned by conventional means, for example by reactive ion etching (RIE). Dielectric layer 102 may be $SiO_2$, $SiN_x$, phosphosilicate glass, (PSG), borophosphosilicate glass (BPSG), a spin-on-glass, flowable oxide, or similar materials. Note also that more than one dielectric layer can be used in place of single layer 102 Conductive plug 104 has been formed by a conventional process such as chemical vapor deposition (CVD) followed by planarization by chemical mechanical polishing (CMP) for example. Plug 104 may be doped polysilicon, W, or any suitably conductive material. Note that the diameter of plug 104 is not critical, and may be significantly narrower or wider than as shown. After an etch-back process to recess plug 104 below the surface of dielectric 102, diffusion barrier 120 has been formed again by a conventional process such as sputtering, and may be $Ta_{1-x}Si_xN_y$ with $0<x<1$ and $y>0$, TiN, or similar materials.

Conductive layer 200 and dielectric layer 202 are then formed by conventional means, for example sputter deposition for layer 200 and low temperature CVD, plasma CVD, or sputter deposition for layer 202. An optional adhesion layer (not shown) may be used between layer 200 and layer 202. Conductive layer 200 may be selected from the groups of materials known as noble metals (e.g. Au, Pt, Pd, Ir, Rh, etc.), alloys of noble metals with either noble or non-noble metals, metals whose oxides are conducting (e.g. Ru, Mo, etc.), electrically conducting oxides (e.g. $RuO_2$, $IrO_2$, $Re_2O_3$, etc.), oxidation resistant electrically conducting silicides or nitrides (e.g. $Ta_{1-x}Si_xN_y$, TiN, WN, etc.), or similar materials. Dielectric layer 202 may be of $SiO_2$, $SiN_x$, $Al_2O_3$, flowable oxides, spin-on-glasses, BSG, BPSG, high dielectric constant materials such as BST, or similar materials.

Figure 2B:
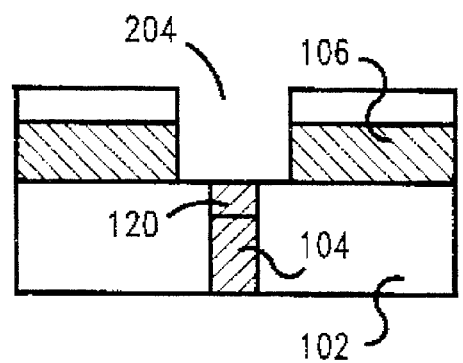

In FIG. 2(b), conductive layer 200 and dielectric layer 202 are patterned conventionally (by reactive ion etching, for example) to form an opening 204 and top electrode 106. Diffusion barrier 120 can function as an etch stop during patterning of layers 200 and 202. Opening 204 may be approximately 0.2 to 0.5 microns in diameter.

Figure 2C:
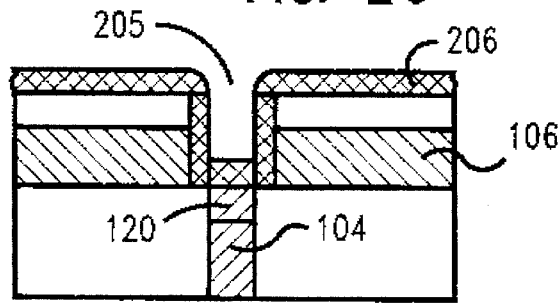
Figure 2D:
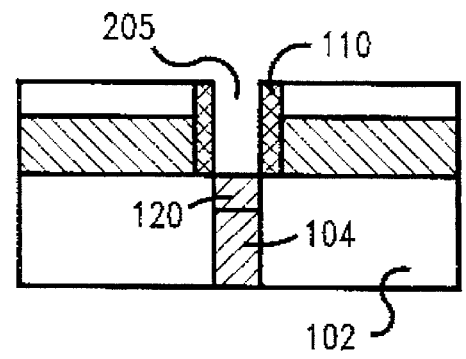

Opening 204 is then cleaned using conventional means, for example RIE. In FIG. 2(c), a conformal layer of high dielectric constant material 206 is formed, for example by chemical vapor deposition (CVD), and in FIG. 2(d), material 206 is patterned to form sidewall spacer 110 by conventional means, for example by reactive ion etching (RIE), leaving opening 205. High dielectric constant material 206 may be selected from the groups of materials known as ferroelectrics, paraelectrics, perovskites, layered perovskites, relaxors, pyrochlores, or any material with a dielectric constant roughly greater than or equal to 20. Examples of such materials are $Ta_2O_5$, $(Ta_2O_5)_x(TiO_2)_{1-x}$ with $0<x<1$, $PbMg_xNb_{1-x}O_{3+y}$ with $0<x<0.5$, $0<y<1$ (PMN), $(Ba,Sr)TiO_3$ (BST or BSTO), $SrBi_2Ta_2O_9$ (SBT), $BaTiO_3$, $SrTiO_3$, $PbZr_{1-x}Ti_xO_3$ (PZT), $PbZrO_3$, $Pb_{1-x}La_xTiO_3$ (PLT), and $Pb_{1-x}La_x(Zr_yTi_{1-y})_{1-x/4}O_3$ (PLZT).

Figure 2E:
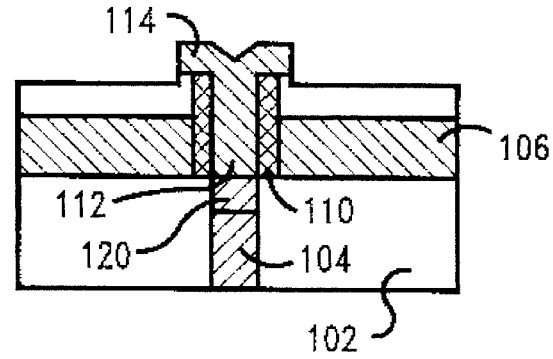
Figure 2F:
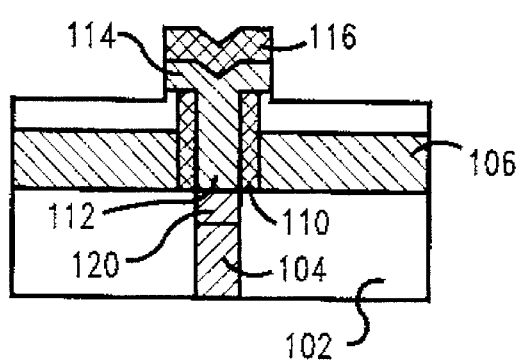

In FIG. 2(e), another conductive layer has been formed and patterned by conventional means (by RIE or ion beam sputtering, for example) to form electrode 112. The bottom of electrode 112 fills opening 205 and a top portion 114 of electrode 112 extends at least out over the top of sidewall spacer dielectric 110. Top portion 114 may also extend out over layer 202 as well. Electrode 112 may be selected from the same group of materials as conductive layer 106. In FIG. 2(f), a second layer of high dielectric constant material is deposited and patterned in a conventional manner to form dielectric layer 116. For process simplicity, electrode 112 and layer 116 may be deposited sequentially and then patterned simultaneously. Layer 116 may be formed from the same class of materials as sidewall spacer dielectric 110.

Figure 2G:
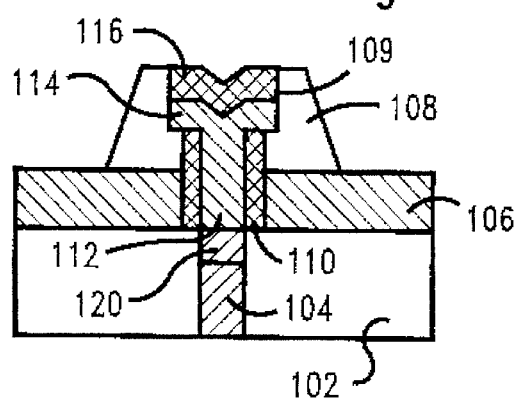

In FIG. 2(g), a dielectric layer of the same or different material as layer 202 is formed over the structure from FIG. 2(f) and patterned by conventional means (for example a self-aligned reactive ion etching process) to leave a dielectric sidewall spacer 108 with a vertical portion 109 and expose the top surface of electrode 112.

Finally, a third electrode 118 is formed over the structure from FIG. 2(g) which is electrically connected to and forms a common electrode with conductive layer 106, resulting in the structure shown in FIG. 1. Electrode 118 may be formed from the same types of materials as electrodes 112 and 106, plus metals whose oxides are non-conducting (e.g. Ti, Al, TiN, W, etc). or a combination material such as a TiN liner with an overcoat of doped polysilicon or W, but is not required to be the same material. Dielectric sidewall spacer 108 with vertical portion 109 prevents shorting between top portion 114 of electrode 112 and electrode 118.

After completion, the capacitor structure may be annealed. During annealing, diffusion barrier 120 acts either as a barrier to oxygen diffusion or a barrier to plug material diffusion or both.

The resulting structure contains two capacitors connected in parallel; the first a sidewall capacitor formed by electrodes 106 and 112 with sidewall spacer dielectric 110, and the second a planar capacitor formed by electrode 112 and 118 with dielectric 116. The sidewall capacitor provides about 60–70% of the necessary capacitance, and the planar capacitor increases the capacitance by 30–40%. Both capacitors have their edges protected with a thick dielectric 108 and thus problems with high fields at the corners and edges of the electrodes are eliminated.

Sample values for the stacked capacitor structure are as follows:

| | |
|---|---|
| Opening 204 in electrode 106 | = 0.30 micron |
| Thickness of electrode 106 | = 0.25 micron |
| Thickness of dielectric 110 | = 0.05 micron |
| Thickness of dielectric 116 | = 0.05 micron |
| Diameter of electrode 112 | = 0.20 micron |
| Sidewall capacitor area | = 0.20 sq. micron |
| Lateral dimension of diel. 116 | = 0.32 micron |
| Planar capacitor area * | = 0.10 sq. micron |
| Total capacitor area | = 0.30 sq. micron |

* Assumes approximately square capacitor with edges same as dielectric 116.

Using these measurements, the aspect ratio of gap 204 is 1:1, which is a reasonable value to be uniformly coated by a chemical vapor deposition (CVD) process.

Figure 3:
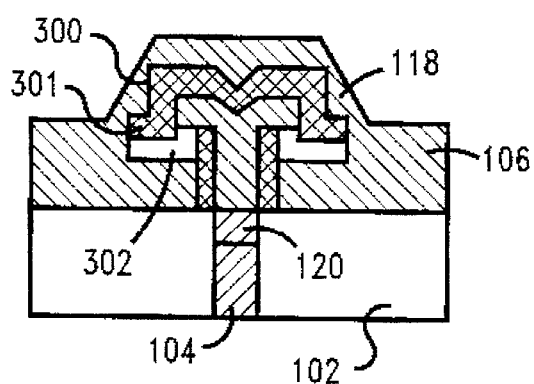
FIG. 3 shows another embodiment of the isolated sidewall capacitor with a dual dielectric.

FIG. 3 shows another embodiment of the dual dielectric capacitor. FIG. 3 is similar to FIG. 1 except that dielectric 300 extends down to surround the perimeter of top portion 114 of electrode 112, and has a horizontal portion 301. Dielectric 302 has no vertical portion as compared to dielectric because dielectric 300 isolates top portion 114 of electrode from electrodes 118 and 106.

Figure 4:
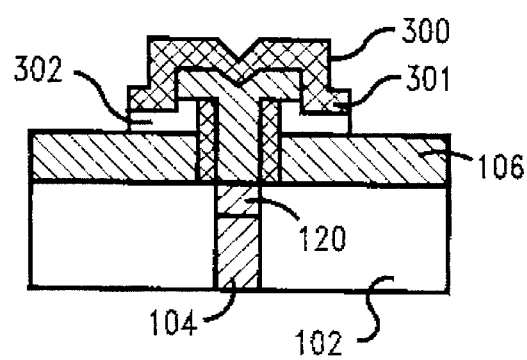
FIG. 4 illustrates an alternate step for the step illustrated in FIG. 2(f), all in accordance with the present invention.

FIG. 4 shows an alternate step to that shown in FIG. 2(f) that may be used to manufacture the capacitor of FIG. 3. In FIG. 4, a conformal layer of high dielectric material is deposited and patterned in a conventional manner to form dielectric layer 300 and expose the top surface of electrode 106. Layer 300 may be formed from the same class of materials as sidewall spacer dielectric 110. Processing continues as above with formation of third electrode 118. In comparison to the structure of FIG. 1, the structure of FIG. 3 has the disadvantage of requiring an additional lithographic alignment step to pattern dielectric 300. However, the structure of FIG. 3 does not require the application and patterning of additional dielectric 109.

In summary, a capacitor has been provided which incorporates a high dielectric constant material which minimizes or avoids contact between silicon and the high dielectric constant material, especially during high dielectric constant material deposition. Furthermore, patterning steps for the electrodes have been minimized, and a good connection is provided between the capacitor and the semiconductor circuit elements in the substrate. The resulting structure has an area of approximately 0.3 sq. microns, and is suitable for large scale production.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A capacitor structure, comprising:
   a first capacitor including a first conductor on top of a substrate, the first conductor having a first opening formed therein, a non-conductive sidewall spacer formed in the first opening, the non-conductive sidewall spacer having a second opening formed therein, a second conductor formed in the second opening, the second conductor having a bottom portion filling the second opening and a top portion extending at least over the non-conductive sidewall spacer;
   a second capacitor including the second conductor, a first non-conductor disposed over the top portion of the second conductor, a third conductor disposed over the first non-conductor, the third conductor electrically connected to the first conductor; and
   a second non-conductor isolating the first conductor from the second conductor.

2. The capacitor structure of claim 1 wherein the non-conductive sidewall spacer and the first non-conductor are made of a high dielectric constant material.

3. The capacitor structure of claim 2 wherein the high dielectric constant material is a material with a dielectric constant greater than approximately 20.

4. The capacitor structure of claim 2 wherein the high dielectric constant material is a material selected from the group consisting of ferroelectrics, paraelectrics, relaxors, perovskites, layered perovskites, and pyrochlores.

5. The capacitor structure of claim 3 wherein the high dielectric constant material is $(Ba,Sr)TiO_3$.

6. The capacitor structure of claim 1 wherein the second non-conductor is made of a low dielectric constant material.

7. The capacitor structure of claim 6 wherein the low dielectric constant material is a material selected from the group consisting of $SiO_2$, $SiN_x$, $Al_2O_3$, flowable oxides, spin-on-glasses, BSG, and BPSG.

8. The capacitor structure of claim 1 wherein the first, second, and third conductors are made of materials selected from the group consisting of noble metals, alloys of noble metals with noble or non-noble metals, metals whose oxides are conducting, electrically conducting oxides, and electrically conducting nitrides.

9. The capacitor structure of claim 1 wherein the first conductor is made of a material selected from the group consisting of Au, Pt, Pd, Ir, Rh, Ru, Mo, $RuO_2$, $IrO_2$, $Re_2O_3$, TiN, TaN, TaSiN, and WN.

10. The capacitor structure of claim 1 wherein the second conductor is made of a material selected from the group consisting of Au, Pt, Pd, Ir, Rh, Ru, Mo, $RuO_2$, $IrO_2$, $Re_2O_3$, TiN, TaN, TaSiN, and WN.

11. The capacitor structure of claim 1 wherein the third conductor is made of a material selected from the group consisting of Au, Pt, Pd, Ir, Rh, Ru, Mo, $RuO_2$, $IrO_2$, $Re_2O_3$, TiN, TaN, TaSiN, WN, and conducting materials having oxides which are non-conducting.

12. The capacitor structure of claim 1 further comprising a third non-conductor below the first conductor and the non-conductive sidewall spacer, the third non-conductor having a third opening formed therein, at least part of the third opening positioned underneath the second opening.

13. The capacitor structure of claim 12 further comprising a conductive plug formed in the third opening, the conductive plug providing electrical contact between the second conductor and circuit elements in the substrate.

14. The capacitor structure of claim 13 further comprising a diffusion barrier layer between the conductive plug and the second conductor, the diffusion barrier substantially in register with the conductive plug.

15. The capacitor structure of claim 1 wherein the second non-conductor has a horizontal portion extending underneath the top portion of the second conductor to contact the non-conductive sidewall spacer.

16. The capacitor structure of claim 15 wherein the second non-conductor has a vertical portion laterally surrounding the top portion of the second conductor.

17. The capacitor structure of claim 16 wherein the vertical portion of the second non-conductor also laterally surrounds the first non-conductor.

18. A method for making a capacitor structure, comprising the steps of:
   forming a first capacitor including a first conductor on top of a substrate, the first conductor having a first opening formed therein, a non-conductive sidewall spacer formed in the first opening, the non-conductive sidewall spacer having a second opening formed therein, a second conductor formed in the second opening, the second conductor having a bottom portion filling the second opening and a top portion extending at least over the non-conductive sidewall spacer;
   forming a second capacitor including the second conductor, a first non-conductor disposed over the top portion of the second conductor, a third conductor disposed over the first non-conductor, the third conductor electrically connected to the first conductor; and
   forming a second non-conductor isolating the first conductor from the second conductor.

19. The method of claim 18 further comprising the step of forming a third non-conductor below the first conductor and the non-conductive sidewall spacer, the third non-conductor having a third opening formed therein, at least part of the third opening positioned underneath the second opening.

20. The method of claim 19 further comprising the step of forming a conductive plug in the third opening, the conductive plug providing electrical contact between the second conductor and circuit elements in the substrate.

21. The method of claim 20 further comprising the step of forming a diffusion barrier layer between the conductive plug and the second conductor, the diffusion barrier substantially in register with the conductive plug.

22. The method of claim 20 wherein the second non-conductor has a horizontal portion extending underneath the top portion of the second conductor to contact the non-conductive sidewall spacer.

23. The method of claim 22 wherein the second non-conductor has a vertical portion laterally surrounding the top portion of the second conductor.

24. The method of claim 23 wherein the vertical portion of the second non-conductor also laterally surrounds the first non-conductor.

* * * * *